United States Patent
Katou

(10) Patent No.: US 7,981,754 B2
(45) Date of Patent: Jul. 19, 2011

(54) MANUFACTURING METHOD OF BONDED SOI SUBSTRATE AND MANUFACTURING METHOD OF SEMICONDUCTOR DEVICE

(75) Inventor: Hiroaki Katou, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 30 days.

(21) Appl. No.: 12/373,133

(22) PCT Filed: Aug. 13, 2007

(86) PCT No.: PCT/JP2007/066075
§ 371 (c)(1),
(2), (4) Date: Jan. 9, 2009

(87) PCT Pub. No.: WO2008/029607
PCT Pub. Date: Mar. 13, 2008

(65) Prior Publication Data
US 2010/0055870 A1    Mar. 4, 2010

(30) Foreign Application Priority Data
Sep. 7, 2006 (JP) ................................ 2006-242670

(51) Int. Cl.
*H01L 21/331* (2006.01)
(52) U.S. Cl. . 438/311; 438/455; 438/458; 257/E21.567; 257/E21.568; 257/E21.57
(58) Field of Classification Search ........... 438/311, 438/455, 458; 257/E21.567, E21.568, E21.57
See application file for complete search history.

(56) References Cited

U.S. PATENT DOCUMENTS

| | | | |
|---|---|---|---|
| 6,455,399 B2 * | 9/2002 | Malik et al. | 438/460 |
| 7,084,046 B2 * | 8/2006 | Mitani et al. | 438/459 |
| 2003/0040163 A1 | 2/2003 | Yokokawa et al. | |
| 2003/0227057 A1 * | 12/2003 | Lochtefeld et al. | 257/347 |

(Continued)

FOREIGN PATENT DOCUMENTS
EP    1 187 216    3/2002
(Continued)

OTHER PUBLICATIONS

Chao et al:, "Investigation of silicon-on-insulator (SOI) substrate preparation using the smart-cut<TM> process", Nuclear Instruments & Methods in Physics With Materials and Atoms, Elsevier, Amsterdam, NL, vol. 237, No. 1-2, Aug. 2005, pp. 197-202, XP005010134, ISSN: 0168-583X, p. 198, left-hand column, paragraph 3, p. 199, left-hand column, paragraph 2, figure 1.
Taiwan Official Action—096130105—Apr. 6, 2011.

*Primary Examiner* — Khiem D Nguyen
(74) *Attorney, Agent, or Firm* — Young & Thompson

(57) ABSTRACT

To provide a manufacturing method of a semiconductor substrate and a manufacturing method of a semiconductor device, which prevent reduction in breakdown voltage of a gate oxide film of a device formed in a semiconductor substrate to improve a reliability of the gate oxide film. A manufacturing method of a semiconductor substrate according to the present invention includes: exposing a silicon surface of an active layer substrate 1 made of single-crystal silicon, to which a semiconductor device is formed; forming an oxide film on a support substrate 2 made of single-crystal silicon; and bonding the silicon surface of the active layer substrate 1 to the oxide film formed on the support substrate 2. The silicon surface of the active layer substrate 1 is exposed by removing a spontaneous oxidation film 7 formed on the surface.

19 Claims, 12 Drawing Sheets

U.S. PATENT DOCUMENTS

| | | |
|---|---|---|
| 2004/0035525 A1 | 2/2004 | Yokokawa et al. |
| 2005/0156246 A1 | 7/2005 | Lochtefeld et al. |
| 2006/0014330 A1 | 1/2006 | Ichidawa et al. |
| 2006/0148208 A1 | 7/2006 | Popov |
| 2007/0281439 A1* | 12/2007 | Bedell et al. ............ 438/455 |
| 2008/0223285 A1* | 9/2008 | Lee ............................ 117/2 |

FOREIGN PATENT DOCUMENTS

| | | |
|---|---|---|
| EP | 1 381 086 | 1/2004 |
| EP | 1 571 693 | 9/2007 |
| JP | 2006-5341 | 1/2006 |
| TW | 511141 | 11/2002 |

* cited by examiner

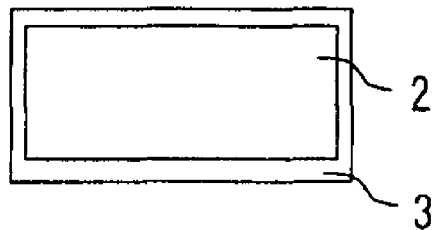
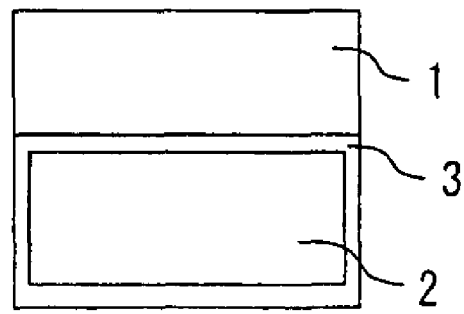
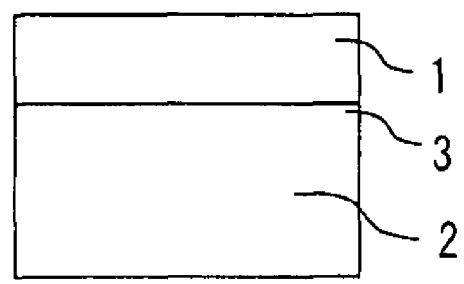

Fig. 4

| CLEANING METHOD | SOLUTION | ABILITY TO REMOVE PARTICLE | ABILITY TO REMOVE ORGANIC MATERIAL | ABILITY TO REMOVE METAL CONTAMINANT | ETCHING OF Si AND $SiO_2$ |
|---|---|---|---|---|---|
| 1 | $NH_4OH/H_2O_2$ (SC1) | HIGH | MID | LOW | ABOUT 1nm/Min |
| 2 | $HCl/H_2O_2$ (SC2) | LOW | LOW | HIGH | — |

| SAMPLE | PRE-BONDING CLEANING | RATE OF DESTRUCTION OF GATE OXIDE FILM AT INTRINSIC BREAKDOWN VOLTAGE (%) | CRYSTAL DEFECT |
|---|---|---|---|
| 1 | $NH_4OH/H_2O_2$ (SC1) | 93 | CRYSTAL DEFECT FOUND |
| 2 | $HCl/H_2O_2$ (SC2) | 10 | NO CRYSTAL DEFECT |

Fig. 5

| PRE-BONDING TREATMENT | ETCHING OF Si AND SiO$_2$ | BREAKDOWN VOLTAGE OF GATE OXIDE FILM IN-PLANE DISTRIBUTION | CRYSTAL DEFECT |
|---|---|---|---|
| NH$_4$OH/H$_2$O$_2$ (SC1) | ABOUT 1nm/Min | ▨ CHIP DESTROYED AT INTRINSIC BREAKDOWN VOLTAGE<br>▨ CHIP DESTROYED AT INTRINSIC BREAKDOWN VOLTAGE OR LESS<br><br>※A ※B<br><br>※ A, B REPRESENT SITES WHERE CRYSTAL DEFECTS ARE OBSERVED. | ※A: DEFECT FOUND<br>※B: NO DEFECT |
| HF | ABOUT 10nm/sec | ▨ CHIP DESTROYED AT INTRINSIC BREAKDOWN VOLTAGE<br>▨ CHIP DESTROYED AT INTRINSIC BREAKDOWN VOLTAGE OR LESS<br><br>※C ※D<br><br>※ C, D REPRESENT SITES WHERE CRYSTAL DEFECTS ARE OBSERVED. | ※C: NO DEFECT<br>※D: DEFECT FOUND |

Fig. 8

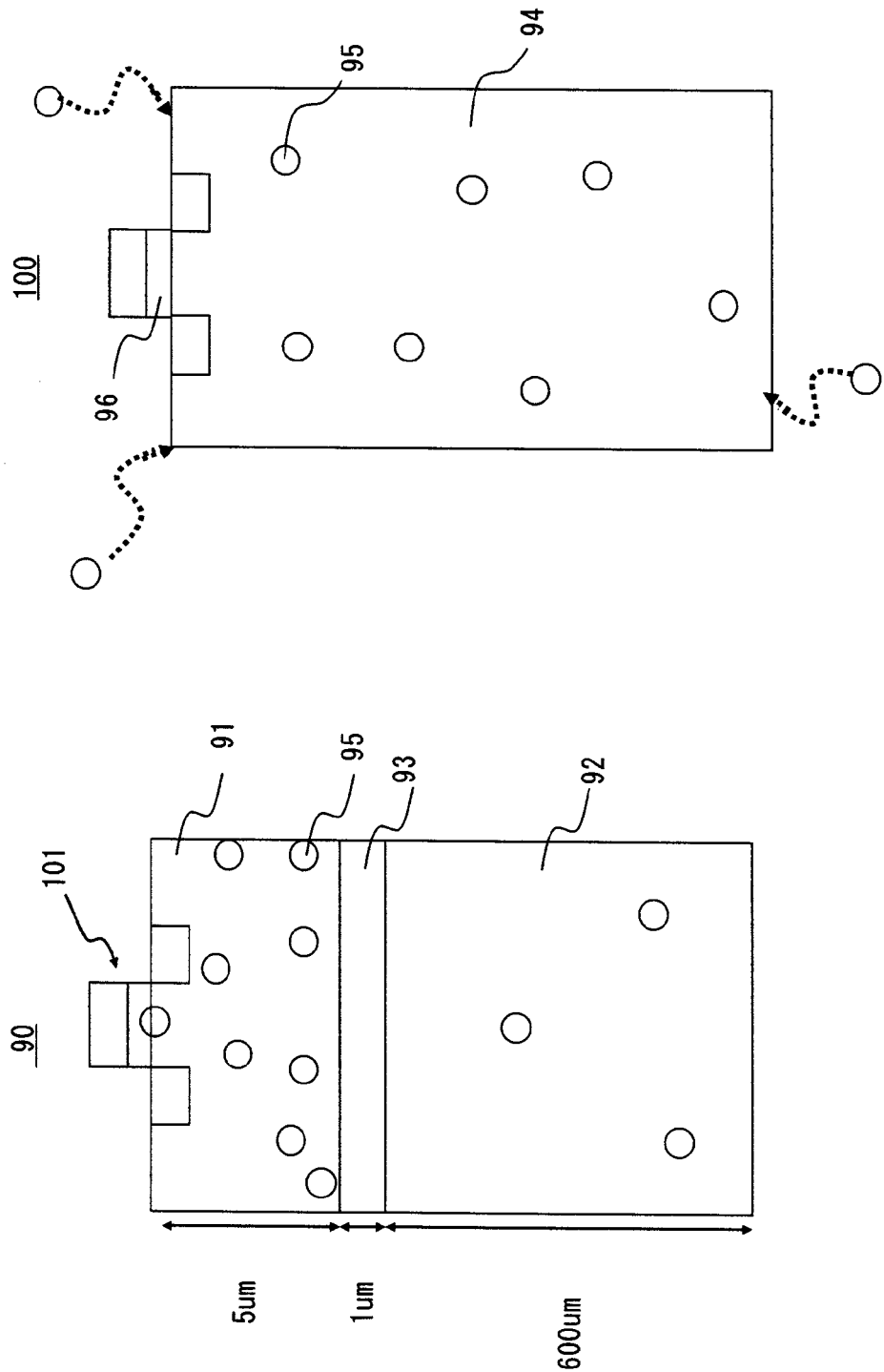

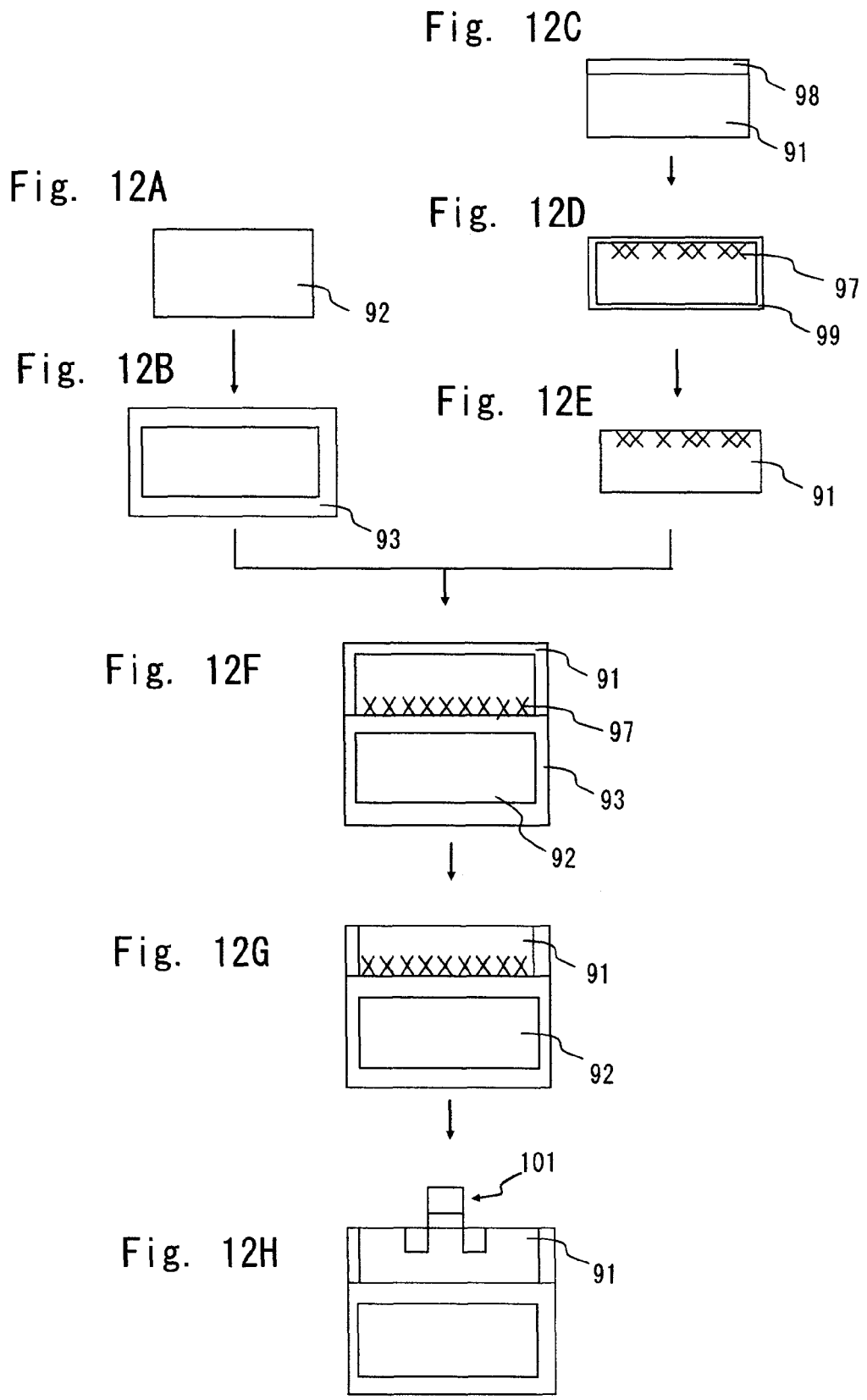
PRIOR ART

US 7,981,754 B2

MANUFACTURING METHOD OF BONDED SOI SUBSTRATE AND MANUFACTURING METHOD OF SEMICONDUCTOR DEVICE

TECHNICAL FIELD

The present invention relates to a manufacturing method of a semiconductor substrate and a manufacturing method of a semiconductor device. In particular, the invention relates to a manufacturing method of a bonding SOI substrate, and a manufacturing method of a semiconductor device using a bonding SOI substrate.

BACKGROUND ART

High-speed operations have been required of a large scale integrated circuit. Reduction of a parasitic capacitance is indispensable for higher-speed operations of the large scale integrated circuit. An SOI (Silicon on Insulator) substrate technique has been expected as a promising technique for reducing this parasitic capacitance. FIG. 11A is a schematic diagram of a semiconductor device 90 (hereinafter referred to as "SOI device 90") where a transistor and the like are formed in an SOI substrate. FIG. 11B is a schematic diagram of a semiconductor device 100 (hereinafter referred to as "Si substrate device 100") where a transistor and the like are formed in an Si substrate. As shown in FIG. 11A, the SOI substrate is constituted of an Si-made active layer substrate (SOI layer) 91, a support substrate 92 supporting the SOI layer 91 from the rear side, and a buried oxide film ($SiO_2$) 93 having the thickness of several μm and formed between the two substrates. A device 101 such as a transistor is formed in the active layer substrate 91 of the SOI substrate to thereby complete the SOI device 90. The SOI device 90 is separated into the SOI layer 91 and the support substrate 92 across the buried oxide film 93. Therefore, a transistor or the like can be formed in the thin SOI layer 91 in the SOI device 90, and a parasitic capacitance of source/drain regions can be reduced to thereby enable higher-speed operations than the Si substrate device 100 of the related art, in which a transistor or the like is directly formed in the Si substrate 94 as shown in FIG. 11B.

However, the SOI device 90 has a problem that defects are likely to occur in a gate oxide film of the device due to metal impurities generated in production facility or the like at the time of manufacturing a device. As shown in FIG. 11B, the Si substrate device 100 of the related art includes gettering sites enough to trap metal impurities 95, in the Si substrate 94. The gettering sites trap the metal impurities 95 or the like. Thus, even if metal impurities are mixed in the Si substrate 94 during a manufacturing process of the Si substrate device 100, the gettering sites trap the metal impurities 95 or the like. As a result, defects of the gate oxide film 96 in the device due to the metal impurities 95 or the like can be suppressed.

On the other hand, in the SOI device 90 of FIG. 11A, the SOI layer 91 is thin, so the number of gettering sites that trap the metal impurities 95 is small. Further, $SiO_2$ for forming the buried oxide film 93 is interposed between the Si-made SOI layer 91 and the support substrate 92. Since a diffusion coefficient of metal is lower in $SiO_2$ than in Si, the metal impurities 95 cannot pass through the $SiO_2$ with ease. As a result, the metal impurities 95 are accumulated in the SOI layer 91. That is, the metal impurities 95 are accumulated in the SOI layer 91, with the result that the metal impurities 95 are more likely to adversely affect a device formed in the SOI layer substrate 91. The contamination with the metal impurities 95 might cause junction leak or reduction in breakdown voltage of a gate oxide film.

As a method of suppressing defects of the gate oxide film due to metal impurities, there is a gettering technique forming a crystal defect in a substrate and capturing metal impurities with the crystal defect. The gettering technique is disclosed in Patent Document 1. Referring to FIGS. 12A to 12H, a manufacturing method of an SOI device with gettering sites as disclosed in Patent Document 1 is described. As shown in FIG. 12A, a support substrate 92 is first prepared. As shown in FIG. 12B, a buried oxide film 93 is then formed to surround the support substrate 92.

As shown in FIG. 12C, an active layer substrate 91 is prepared, and a predetermined amount of dopant such as arsenic or antimony or the like is selectively doped to the active layer substrate 91. At this time, the surface portion of the Si-made active layer substrate 91 is turned amorphous through the dopant injection to form an amorphous layer 98. As shown in FIG. 12D, the active layer substrate 91 is subjected to heat treatment next to diffuse the dopant. At this time, the amorphous layer 98 is recrystallized. Here, the heat treatment for diffusing the dopant is carried out under an oxygen atmosphere, so oxygen, silicon, and the like are supplied to the amorphous layer 98 to hinder the amorphous layer 98 from recrystallizing, and crystal defects 97 are formed. At this time, a silicon oxide film 99 is formed around the active layer substrate 91. After that, as shown in FIG. 12E, the active layer substrate 91 is treated with SC1 cleaning and SC2 cleaning prior to bonding for the purpose of removing contaminants. As shown in FIG. 12F, the support substrate 92 with the buried oxide film 93 is then bonded to the active layer substrate 91 on the crystal defect 97 side, followed by heat treatment. As shown in FIG. 12G, the active layer substrate 91 is ground or polished. As shown in FIG. 12H, a device 101 such as a transistor or the like is formed in the ground or polished surface of the active layer substrate 91 to thereby complete an SOI device.

[Patent Document 1]
Japanese Unexamined Patent Application Publication No. 2006-5341

DISCLOSURE OF THE INVENTION

However, in the above technique as disclosed in Patent Document 1, the crystal defects 97 cannot be formed unless a dopant is injected and then heat treatment is carried out, so a dopant injection step and a heat treatment step cannot be omitted. That is, there arises a problem in that the number of manufacturing steps for an SOI device is increased. There is another problem that a breakdown voltage is lowered in such a device that a depletion layer reaches where a dopant is injected.

In one embodiment of the present invention, a manufacturing method of a semiconductor substrate includes: exposing a silicon surface of an active layer substrate made of single-crystal silicon, to which a semiconductor device is formed; forming an oxide film on a support substrate made of single-crystal silicon; and bonding the silicon surface of the active layer substrate to the oxide film formed on the support substrate.

According to the one embodiment of the present invention, the exposed surface of the active layer substrate made of single-crystal silicon is bonded to the support substrate made of single-crystal silicon with the oxide film formed thereon. Hence, crystal defects are formed in the silicon surface as a bonding surface between the silicon surface of the active layer substrate and the oxide film formed on the support substrate.

According to a manufacturing method of a semiconductor substrate of the present invention, crystal defects formed in an active layer substrate trap metal impurities to prevent reduction in breakdown voltage of a gate oxide film of a device formed in a semiconductor substrate to improve a reliability of the gate oxide film.

BRIEF DESCRIPTION OF THE DRAWINGS

FIGS. 2A to 2D are schematic diagrams showing a manufacturing process of a manufacturing method of an SOI substrate with an oxide film on a support substrate side;

FIG. 4 shows a pre-bonding cleaning method of an SOI substrate and its effects;

FIG. 5 shows a rate of destruction of a gate oxide film of an SOI device at an intrinsic breakdown voltage in Samples 1 and 2, and whether or not crystal defects are formed;

FIG. 8 shows in-plane distribution of a breakdown voltage of a gate oxide film of an SOI device under different pre-bonding cleaning conditions, and whether or not crystal defects are formed;

FIG. 11A is a schematic diagram of a semiconductor device where a transistor and the like are formed in an SOI substrate;

FIG. 11B is a schematic diagram of a semiconductor device of the related art where a transistor and the like are formed in an Si substrate; and FIGS. 12A to 12H are schematic diagrams of a manufacturing process of an SOI device of the related art, in which a dopant is ion-implanted.

Figure 1A:
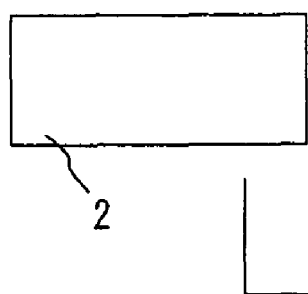
FIGS. 1A to 1D are schematic diagrams showing a manufacturing process of a manufacturing method of an SOI substrate with an oxide film on an active layer substrate side.

DESCRIPTION OF REFERENCE NUMERALS 1, 91 ACTIVE LAYER SUBSTRATE
2, 92 SUPPORT SUBSTRATE
3, 93 BURIED OXIDE FILM
4, 97 CRYSTAL DEFECT
5, 95 METAL IMPURITY
6 $SiO_2$-MADE OXIDE FILM
7 SPONTANEOUS OXIDATION FILM
8A SOURCE REGION
8B GATE REGION
9, 96 GATE OXIDE FILM
10 GATE ELECTRODE
90 SOI DEVICE
94 SI SUBSTRATE
98 AMORPHOUS LAYER
99 SILICON OXIDE FILM
100 SI SUBSTRATE DEVICE
101 DEVICE SUCH AS TRANSISTOR

BEST MODES FOR CARRYING OUT THE INVENTION

As described above, a manufacturing method of an SOI substrate of the related art includes a step of injecting a dopant and the like and thus has problems in that a manufacturing process of an SOI substrate is complicated and a breakdown voltage is lowered in such a device that a depletion layer reaches where a dopant is injected. The inventor of the subject application has made extensive studies to solve these problems and finally found that crystal defects are formed between an active layer substrate and a buried oxide film only by completely removing a spontaneous oxidation film formed on an active layer substrate to expose an Si surface and then bonding the Si surface to a support substrate with an oxide film, followed by heat treatment.

Figure 1B:
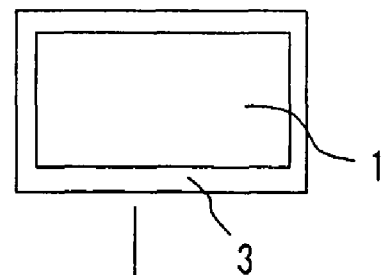
Figure 1C:
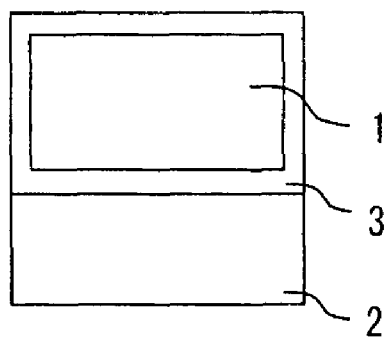
Figure 1D:
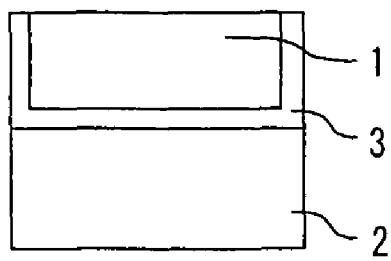

According to the present invention, a bonding surface (referred also to as "joint surface") between a support substrate and an active layer substrate is positioned on an oxide film formed on a support substrate. The reason therefor is described below. In general, as a manufacturing method of a bonding SOI substrate, there are two methods: a method of bonding a support substrate onto an active layer substrate having an oxide film formed thereon (hereinafter referred to as "oxide film on an active layer substrate side") and a method of bonding an active layer substrate onto a support substrate having an oxide film formed thereon (hereinafter referred to as "oxide film on a support substrate side"). Referring first to FIGS. 1A to 1D, a manufacturing method of an SOI substrate with an oxide film on an active layer substrate side is described. As shown in FIG. 1A, a support substrate 2 is prepared first. As shown in FIG. 1B, an active layer substrate 1 is then prepared to form a buried oxide film 3 around the active layer substrate 1. As shown in FIG. 1C, the support substrate 2 is next bonded to the active layer substrate 1 with the buried oxide film 3, followed by heat treatment. As shown in FIG. 1D, the active layer substrate 1 is then ground or polished to form a device on the active layer substrate 1.

Referring next to FIGS. 2A to 2D, a manufacturing method of an SOI substrate with an oxide film on a support substrate side is described. As shown in FIG. 2A, the buried oxide film 3 is first formed around the support substrate 2. As shown in FIG. 2B, the active layer substrate 1 is prepared next. Subsequently, as shown in FIG. 2C, the active layer substrate 1 is bonded to the support substrate 2 with the buried oxide film 3, followed by heat treatment. As shown in FIG. 2D, the active layer substrate 1 is then ground or polished to form a device on the active layer substrate 1.

Figure 3A:
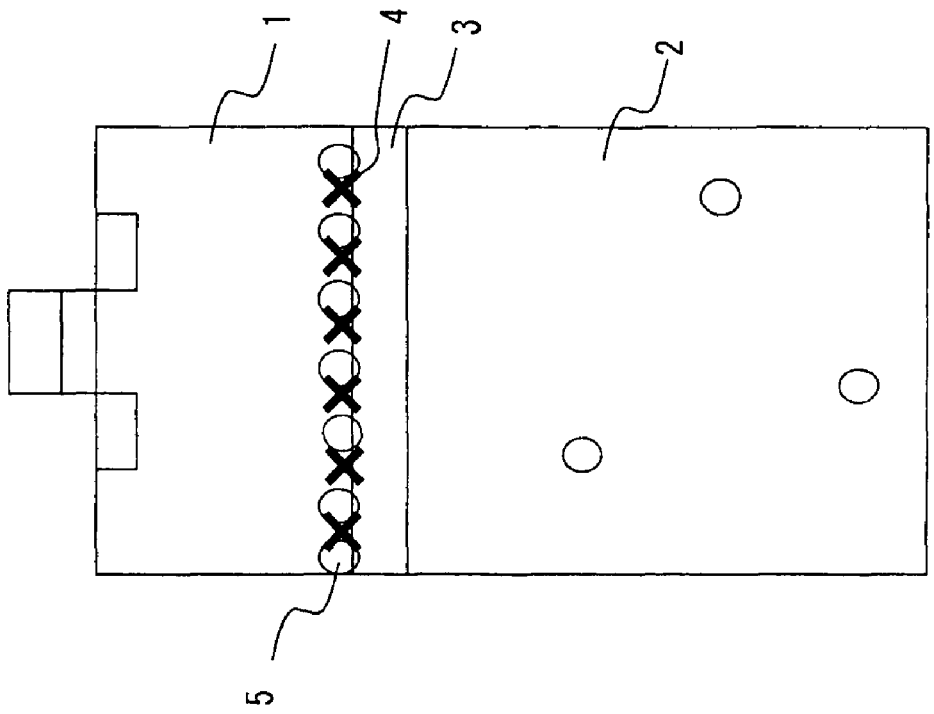
FIGS. 3A and 3B are schematic diagrams of an SOI device where crystal defects are formed on an upper side of a bonding surface between a support substrate and an active layer substrate.
Figure 3B:
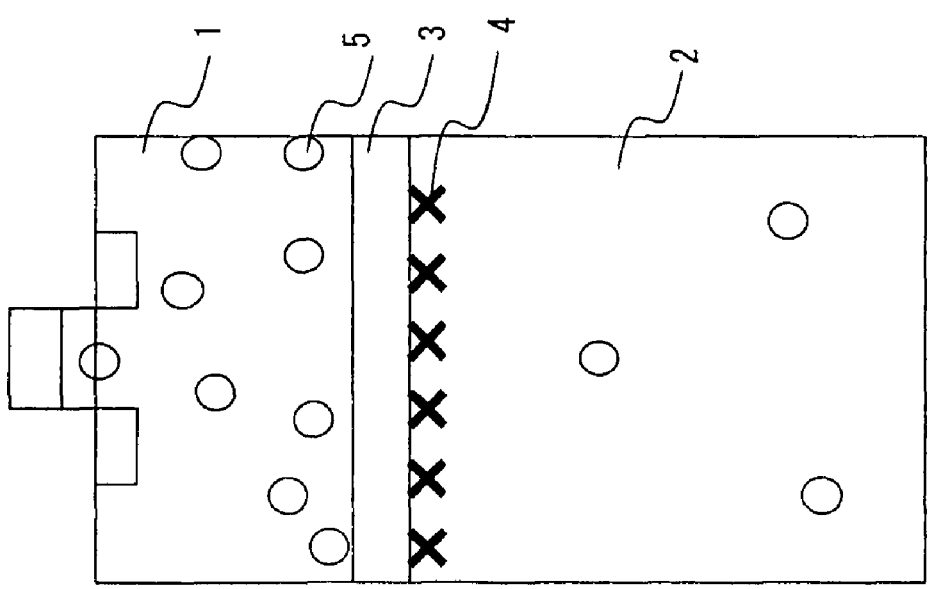

In this example, it is effective to form crystal defects in the active layer substrate 1 to prevent defects of a gate oxide film. The reason therefor is described below. FIG. 3A is a schematic diagram of an SOI device with an oxide film on an active layer substrate side where crystal defects are formed in a support substrate. FIG. 3B is a schematic diagram of an SOI device with an oxide film on a support substrate side where crystal defects are formed in an active layer substrate. As discussed later, the crystal defects are formed between an exposed Si substrate and the buried oxide film 3. Therefore, as shown in FIG. 3A, if the method of the present invention is applied to the device with an oxide film on an active layer substrate side, crystal defects 4 are formed in the support substrate 2 below the buried oxide film 3 in the SOI device with an SOI device with an oxide film on an active layer substrate side. Further, as described above, the $SiO_2$-made buried oxide film 3 has a lower diffusion coefficient than that of the Si-made active layer substrate 1, so a diffusion speed of metal impurities 5 is slow in the buried oxide film 3. Therefore, the metal impurities 5 cannot easily pass through the buried oxide film 3. As a result, the crystal defects 4 formed below the buried oxide film 3 cannot trap the metal impurities 5 in the active layer substrate 1, and the metal impurities 5 are accumulated in the active layer substrate 1. That is, the metal impurities 5 accumulated in the active layer substrate 1 cause defects of a gate oxide film.

On the other hand, as shown in FIG. 3B, if the method of the present invention is applied to the device with an oxide film on a support substrate side, the crystal defects 4 are formed in the active layer substrate 1 (silicon surface) on the buried oxide film 3 (bonding surface between the silicon surface of the active layer substrate and the oxide film formed on the support substrate) in the SOI device with an oxide film on a support substrate side. Hence, the metal impurities 5 and the like in the active layer substrate 1 are trapped by the crystal defects 4. That is, the method of the present invention is applied to the SOI device with an oxide film on a support substrate side, making it possible to prevent the metal impurities 5 from causing defects of the gate oxide film. For that reason, according to the present invention, the oxide film on a support substrate side of FIG. 3B is employed.

Further, the inventor of the subject application has found a technique effective for forming the crystal defects 4 at a bonding surface (silicon surface) of the active layer substrate 1 with reliability. That is, a spontaneous oxidation film on the surface of the active layer substrate 1 is completely removed to expose a clean Si surface and the Si surface is bonded to the support substrate with an oxide film. The reason therefor is described next. To begin with, two cleaning methods are compared. These cleaning methods differ from each other in cleaning conditions of an active layer substrate prior to bonding of a support substrate with the active layer substrate (hereinafter referred to as pre-bonding treatment). FIG. 4 shows the cleaning methods and effects thereof. As shown in FIG. 4, a cleaning method 1 using Sample 1 is SC1 cleaning with a mixed solution of $NH_4OH$, $H_2O_2$, and $H_2O$, and an etching rate thereof is about 1 nm/min. That is, SC1 is an alkali solution, so $SiO_2$ is etched with hydroxide ions ($OH^-$) functioning as an etchant. Further, SC1 cleaning is not so effective for removal of an organic material, that is, removal of a foreign substance larger than a particle, and removal of metal contaminants. On the other hand, a cleaning method 2 using Sample 2 is SC2 cleaning with a mixed solution of HCl, $H_2O_2$, and $H_2O$, and Si and SiO2 are not etched. Further, SC2 cleaning is not so effective for removal of a particle and removal of an organic material, but is very effective of removal of metal contaminants.

The SOI device with an oxide film on a support substrate side was subjected to pre-bonding treatment with the two cleaning methods. FIG. 5 shows results of evaluating distribution of a breakdown voltage of a gate oxide film of an SOI device with Sample 1 subjected to SC1 cleaning and Sample 2 subjected to SC2 cleaning, and whether or not crystal defects are formed in an active layer substrate. As for the results of evaluating distribution of a breakdown voltage of a gate oxide film, a film having a breakdown voltage of 9.5 MV/cm or higher is broken at an intrinsic breakdown voltage and used as a sample, and a rate of destruction is illustrated as the evaluation result. The evaluation results of FIG. 5 show that crystal defects are formed in the SOI device of Sample 1, and crystal defects are not formed in the SOI device of Sample 2. Further, the evaluation result of distribution of a breakdown voltage of a gate oxide film is more satisfactory in Sample 1 than in Sample 2. As shown in FIG. 5, about 93% of Sample 1 is broken at the intrinsic breakdown voltage, and the rest of about 7% of Sample 1 is broken at a lower voltage than the intrinsic breakdown voltage. In contrast, only about 10% of Sample 2 is broken at the intrinsic breakdown voltage, the rest of about 90% of Sample 2 is broken at a lower voltage than the intrinsic breakdown voltage. That is, in Sample 1, crystal defects are formed, and a gettering effect against metal impurities is exercised. Thus, the distribution of a breakdown voltage of a gate oxide film is improved.

Figure 6:
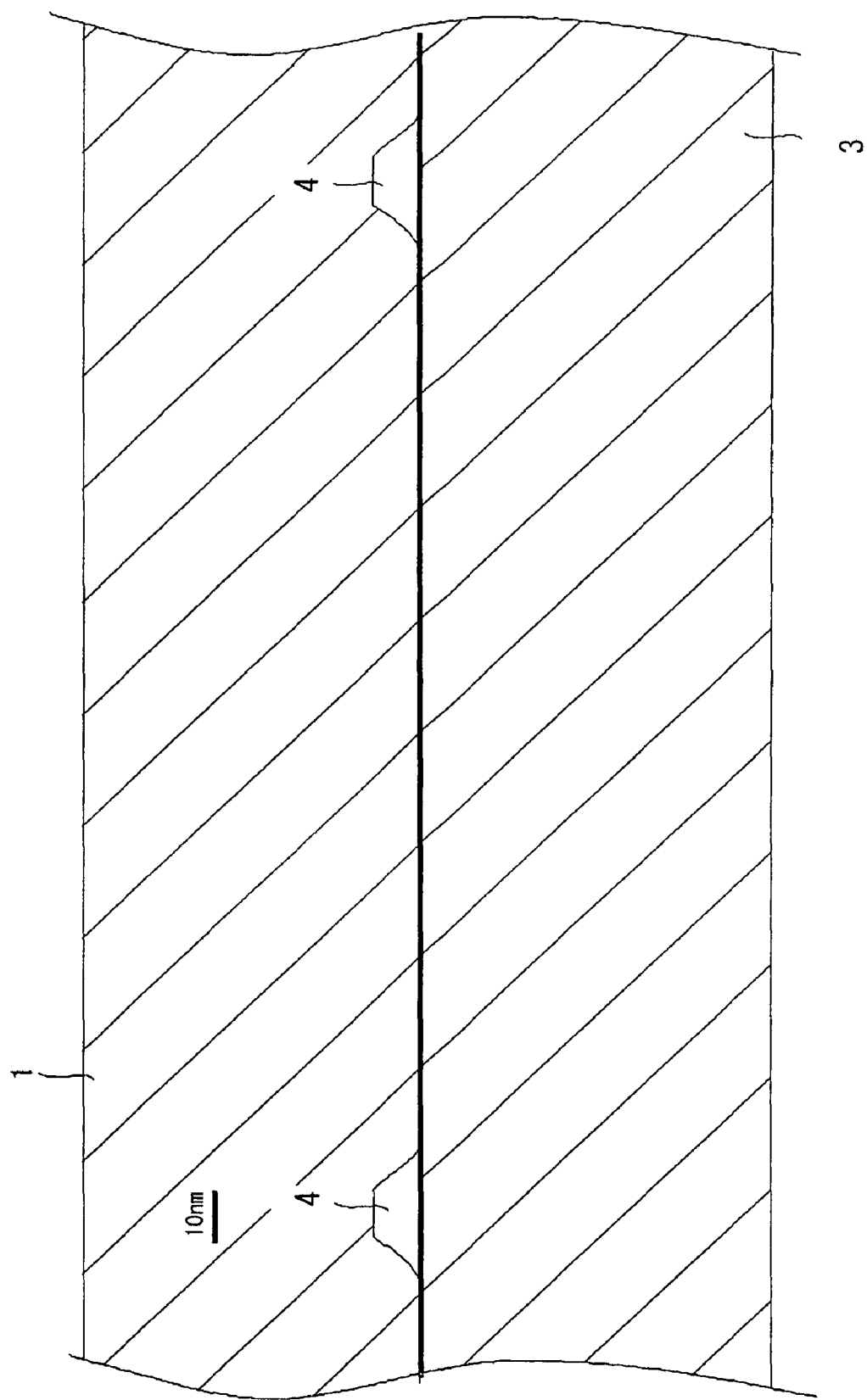
FIG. 6 shows trace plots of a TEM image of an SOI substrate with an oxide film on a support substrate side in Sample 1.

Here, FIG. 6 shows trace plots of a TEM (Transmission Electron Microscope) image of an SOI substrate with an oxide film on a support substrate side in Sample 1, in which crystal defects are formed. FIG. 6 shows trace plots of a portion of the joint surface between the buried oxide film 3 and the active layer substrate 1 with a magnification of 106. As shown in FIG. 6, the crystal defects 4 are formed on the active layer substrate 1 side.

Figure 7C:
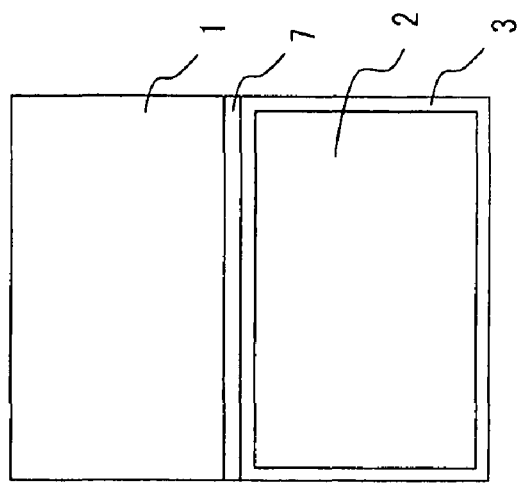
FIGS. 7A to 7C are schematic diagrams of three types of SOI substrates that reflect considerations of the inventor of the present invention.
Figure 7B:
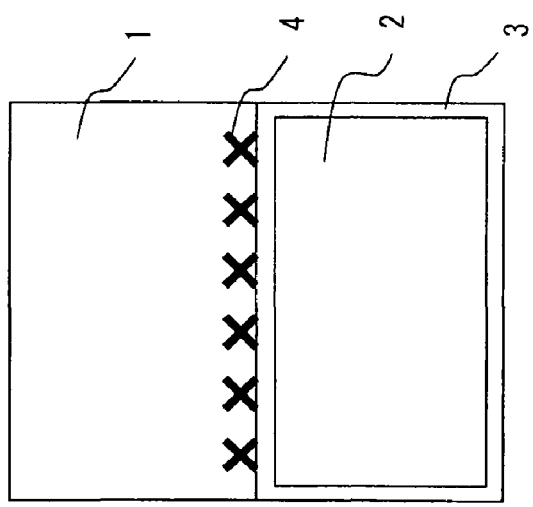
Figure 7A:
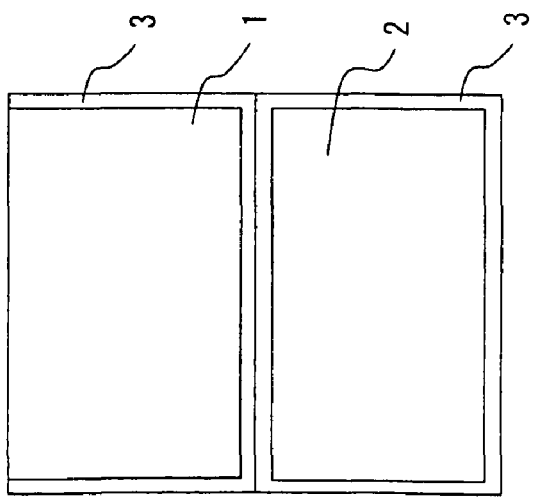

Considerations made by the inventor from the above are explained with three types of SOI substrates with reference to FIGS. 7A to 7C. As shown in FIG. 7A, crystal defects are not formed even if the $SiO_2$-made buried oxide films 3 are bonded. On the other hand, as shown in FIG. 7B, the Si-made active layer substrate 1 is subjected to SC1 cleaning to thereby etch Si and $SiO_2$. As a result, the spontaneous oxidation film 7 is completely removed. Then, the buried oxide film 3 is bonded and heat treatment is carried out, with the result that the crystal defects 4 are formed. Further, as shown in FIG. 7C, if the Si-made active layer substrate 1 is not well cleaned and the spontaneous oxidation film 7 partially remains on the active layer substrate 1, when the active layer substrate 1 and the $SiO_2$-made buried oxide film 3 are bonded, the spontaneous oxidation film 7 is formed on the active layer substrate 1, so crystal defects are not formed.

That is, if pre-bonding treatment is performed with a cleaning solvent capable of etching $SiO_2$ to remove the spontaneous oxidation film, followed by bonding, crystal defects are formed in the active layer substrate.

Here, it is desirable to completely remove the spontaneous oxidation film formed on the active layer substrate upon pre-bonding treatment to form crystal defects without fail. The reason therefor is described next. In this example, description is made of a result of evaluating distribution of a breakdown voltage of a gate oxide film under such conditions that pre-bonding treatment is performed with two cleaning solvents different in ability to etch $SiO_2$. For this evaluation, SC1 cleaning and HF cleaning that has a larger effect of etching Si and $SiO_2$ than the SC1 cleaning are employed. Further, the SOI substrate with an oxide film on an active layer substrate side of Sample 1 with improved distribution of a breakdown voltage of a gate oxide film is used here. FIG. 8 shows a verification test result. In the substrate that underwent SC1 cleaning upon pre-bonding treatment, crystal defects are not formed in some portions, and a breakdown voltage of the gate oxide film in these portions is lowered. On the other hand, in the substrate that underwent HF cleaning upon pre-bonding treatment, the crystal defects are formed throughout the substrate, and a breakdown voltage of the gate oxide film is not lowered.

Figure 9:
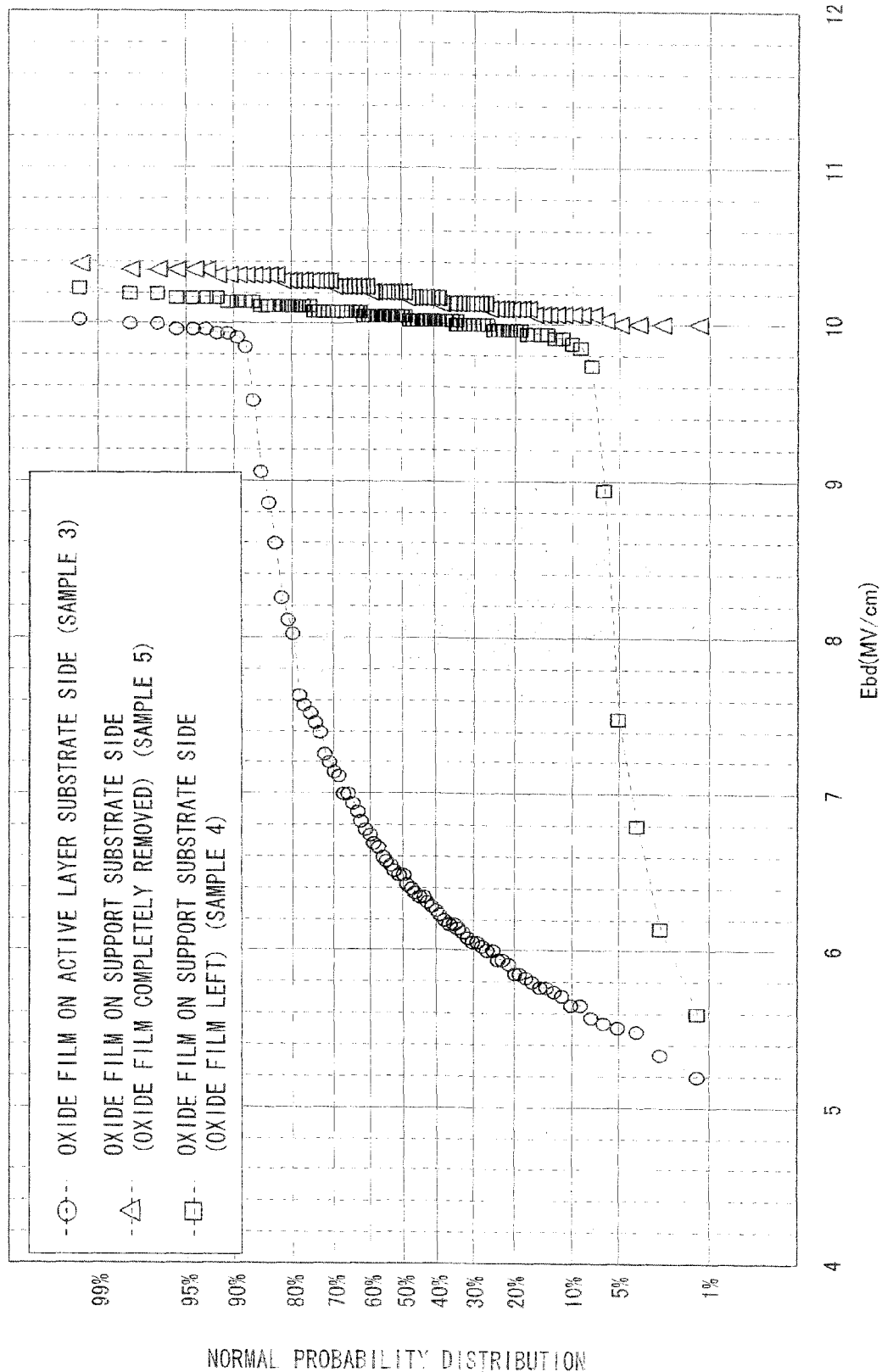
FIG. 9 is distribution chart of a breakdown voltage of a gate oxide film of an SOI device in the case of using a substrate with an oxide film on a support substrate side and a substrate with an oxide film on an active layer substrate side, which are washed with SC1 as pre-bonding treatment.

FIG. 9 shows distribution of a breakdown voltage of a gate oxide film of an SOI device with the substrate with an oxide film on a support substrate side and the substrate with an oxide film on an active layer substrate side, which are subjected to SC1 cleaning upon pre-bonding treatment. IN this example, the horizontal axis represents a breakdown voltage Ebd [MV/cm] of the gate oxide film, and the vertical axis represents a cumulative fraction defective of the gate oxide film. Further, distribution of a breakdown voltage of the SOI device with an oxide film on an active layer substrate side, which is subjected to SC1 cleaning upon pre-bonding treatment is represented by circular plots (Sample 3). In addition, distribution of a breakdown voltage of the SOI device with an oxide film on a support substrate side, which is not cleaned enough with SC1 upon pre-bonding treatment and thus has the spontaneous oxidation film partially left on the active layer substrate is represented by rectangular plots (Sample 4). Moreover, distribution of a breakdown voltage of the SOI device with an oxide film on a support substrate side, which is subjected to SC1 cleaning upon pre-bonding treatment to thereby completely remove the spontaneous oxidation film formed on the active layer substrate is represented by triangular plots (Sample 5).

As shown in FIG. 9, in the SOI device with an oxide film on an active layer substrate side, which includes no crystal defect on the active layer substrate side (Sample 3), about 11% of the substrate is broken at an intrinsic breakdown voltage (a ratio of the gate oxide film having a breakdown voltage of about 9.5 MV/cm or higher), and the rest of 89% of Sample 3 is broken at a lower voltage than the intrinsic breakdown voltage. In contrast, 93% and 100% of the substrate of the SOI device with an oxide film on a support substrate side, which is subjected to SC1 cleaning, are broken at the intrinsic breakdown voltage in Sample 4 and Sample 5, respectively. As understood from this, a rate of destruction of the gate oxide film at the intrinsic breakdown voltage is dramatically improved. Here, in the SOI device where the spontaneous oxidation film is partially left (Sample 4), about 7% of the entire SOI substrate does not have a breakdown voltage of about 9.5 MV/cm. On the other hand, the SOI device from which the spontaneous oxidation film is completely removed (Sample 5) has a breakdown voltage of about 10 MV/cm over the SOI substrate.

That is, pre-bonding cleaning is performed with a cleaning method capable of etching Si and $SiO_2$. Then, the spontaneous oxidation film formed on the active layer substrate is removed to thereby form crystal defects in the substrate of the SOI device. Owing to the crystal defects, a rate of destruction of the gate oxide film of the SOI device at the intrinsic breakdown voltage is improved. That is, in the SOI device, a ratio of areas having a gate oxide film breakdown voltage lower than the intrinsic breakdown voltage to the entire substrate is reduced, and reliability is increased. Here, the spontaneous oxidation film is completely removed to thereby form crystal defects throughout the substrate of the SOI device, so a rate of destruction of the gate oxide film of an SOI device at the intrinsic breakdown voltage is further improved.

As understood from the above, the spontaneous oxidation film formed on the active layer substrate is first removed completely to expose Si of the active layer substrate in order to form crystal defects without fail upon the pre-bonding treatment. Then, the active layer substrate is bonded to the support substrate with the buried oxide film, followed by heat treatment. As a result, crystal defects can be formed throughout the active layer substrate. Thus, a rate of destruction of the gate oxide film of an SOI device at the intrinsic breakdown voltage can be improved, and reliability can be increased.

First Embodiment

Figure 10A:
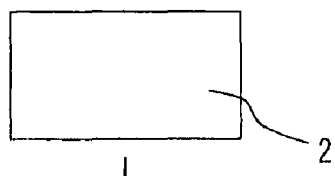
FIGS. 10A to 10G are schematic diagrams of a manufacturing process of an SOI device according to an embodiment of the present invention.

An embodiment of the present invention will be described in detail below with reference to FIGS. 10A to 10G. FIGS. 10A to 10G are schematic diagrams of a manufacturing process for forming an SOI substrate and forming a device to the SOI substrate according to this embodiment. As shown in FIG. 10A, the support substrate 2 made of single-crystal Si is prepared. As shown in FIG. 10B, the support substrate 2 is thermally oxidized to form the $SiO_2$-made buried oxide film 3 around the support substrate 2.

Figure 10C:
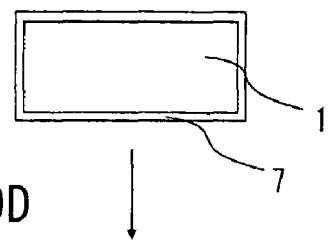
Figure 10B:
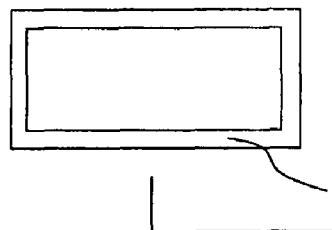
Figure 10D:
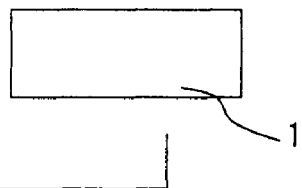

As shown in FIG. 10C, the active layer substrate 1 made of single-crystal Si is prepared next. As shown in FIG. 10D, pre-bonding treatment is then performed to remove the spontaneous oxidation film 7 formed around the active layer substrate 1. As described above, the spontaneous oxidation film 7 formed on the active layer substrate 1 is removed through pre-bonding treatment to thereby form the crystal defects 4 in the active layer substrate 1. As a result, a rate of destruction of the gate oxide film at the intrinsic breakdown voltage can be improved. Therefore, pre-bonding treatment is performed to remove the spontaneous oxidation film 7 formed around the active layer substrate 1 to expose the surface of the active layer substrate 1. That is, pre-bonding treatment that can remove the spontaneous oxidation film 7 formed around the active layer substrate 1 to expose the Si surface portion of the active layer substrate 1.

For example, the above SC1 cleaning is carried out to etch Si and $SiO_2$ to remove the spontaneous oxidation film 7 formed on the active layer substrate 1. Here, a mixing ratio of solutions for SC1 cleaning is preferably $NH_4OH:H_2O_2:H_2O=1:1:5$, but a mixing ratio of $NH_4OH$ can be changed as appropriate if the spontaneous oxidation film 7 can be removed. Further, it is preferable to set enough cleaning time to completely remove the spontaneous oxidation film 7. Moreover, Si and $SiO_2$ can be etched even during HF cleaning. Here, a mixing ratio of solutions for HF cleaning is preferably $HF:H_2O=1:100$, but any mixing ratio can be set insofar as the spontaneous oxidation film 7 can be removed. Further, $HF$—$H_2O_2$ and $HF$—$HCL$ can be used aside from HF in HF cleaning. Moreover, it is possible to remove the spontaneous oxidation film 7 with CMP (Chemical Mechanical Polishing) as mechanical polishing. As understood from the above, pre-bonding treatment can be performed under the following combinations of conditions for the purpose of removing the spontaneous oxidation film 7. For example, pre-bonding treatment involves SC1 cleaning alone, HF cleaning alone, CMP alone, SC1 cleaning and HF cleaning.

As an example of treatment capable of cleaning the active layer substrate 1 albeit small effect of etching Si and $SiO_2$, there are SPM cleaning and SC2 cleaning. For example, SC1 cleaning is performed to etch Si and $SiO_2$ to thereby remove the spontaneous oxidation film 7 formed on the active layer substrate 1. In addition, SPM cleaning, SC2 cleaning, or the like is performed to suppress contamination of the active layer substrate 1. Here, SPM cleaning uses a mixed solution of $H_2SO_4$ and $H_2O_2$, and has a high ability to remove an organic material and a high ability to remove metal contaminants but has a small effect of removing particles. A mixing ratio of solutions for SPM cleaning is preferably $H_2SO_4:H_2O_2=4:1$. Further, a mixing ratio of solutions for SC2 cleaning is preferably $HCl:H_2O_2:H_2O=1:1:6$.

Figure 10E:
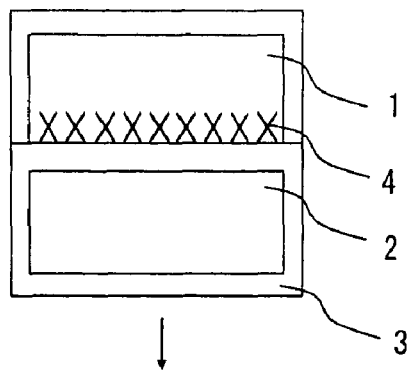
Figure 10F:
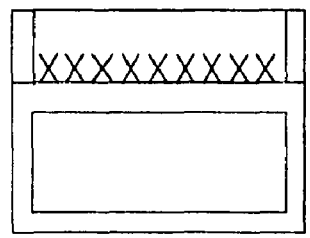

Next, as shown in FIG. 10E, the active layer substrate 1 from which the spontaneous oxidation film 7 is removed enough to expose Si, is bonded to the support substrate 2 with the buried oxide film 3, followed by heat treatment. At this time, the crystal defects 4 are formed near the bonding surface on the active layer substrate 1 side. As shown in FIG. 10F, the surface of the active layer substrate 1 opposite to the bonding surface is next ground or polished into a predetermined thickness. At this time, SC1 cleaning, and SC2 cleaning, SPM cleaning, and the like, which have an effect of removing metal contaminants may be performed for cleaning.

Figure 10G:
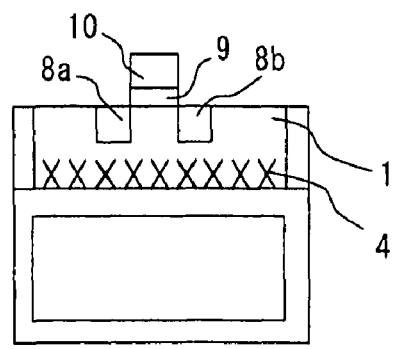

As shown in FIG. 10G, a device is formed next to the SOI substrate completed by bonding the active layer substrate 1 to the support substrate 2 with the buried oxide film 3. That is, a source region 8a and a gate region 8b are formed in the active layer substrate 1. Then, a gate electrode 10 is formed on the active layer substrate 1 through the gate oxide film 9 to thereby form the device to the SOI substrate to complete the SOI device.

In this embodiment, prior to bonding of the active layer substrate 1 to the support substrate 2 with the buried oxide film 3, the spontaneous oxidation film 7 formed on the active layer substrate 1 is removed and the active layer substrate 1 is bonded to the support substrate 2 with the buried oxide film 3. That is, Si of the active layer substrate 1, which is exposed by removing the spontaneous oxidation film 7 is bonded to $SiO_2$ of the buried oxide film 3, followed by heat treatment to thereby form crystal defects near the bonding surface of the active layer substrate 1. The crystal defects near the bonding surface of the active layer substrate 1 trap metal impurities in the active layer substrate 1. As a result, an influence of metal impurities on the gate oxide film 9 formed on the active layer substrate 1 can be suppressed, making it possible to improve a breakdown voltage of the gate oxide film 9. Then, a rate of destruction of the gate oxide film 9 at the intrinsic breakdown voltage can be improved. Further, in this embodiment, the crystal defects 4 can be formed not through a step of implanting ions to the active layer substrate 1 and a heat treatment step of the ion-implanted active layer substrate 1, so a manufacturing cost of the substrate can be saved. Further, it is possible to prevent reduction in breakdown voltage in such a device that a depletion layer reaches where a dopant is injected.

Incidentally, the present invention is not limited to the above embodiments solely but may be variously modified within the scope of the present invention.

INDUSTRIAL APPLICABILITY

The present invention provides a manufacturing method of a semiconductor substrate and manufacturing method of a semiconductor device. In particular, the invention is applicable to a manufacturing method of a bonding SOI substrate, and a manufacturing method of a semiconductor device using a bonding SOI substrate.

The invention claimed is:

1. A manufacturing method of a semiconductor substrate, comprising:
   exposing a first silicon surface of an active layer substrate made of single-crystal silicon, to which a second silicon surface is to be formed;
   forming an oxide film on a support substrate made of single-crystal silicon;
   bonding the second silicon surface of the active layer substrate to the oxide film formed on the support substrate; and
   after bonding, forming crystal defects on the entire second silicon surface of said active layer substrate,
   wherein no dopant remains in the second silicon surface as a bonding surface between the second silicon surface of the active layer substrate and the oxide film formed on the support substrate.

2. The manufacturing method of a semiconductor substrate according to claim 1, wherein a spontaneous oxidation film formed on the first silicon surface of the active layer substrate is removed to expose the silicon surface prior to the bonding.

3. The manufacturing method of a semiconductor substrate according to claim 2, wherein the crystal defects are formed in the second silicon surface as a bonding surface between the second silicon surface of the active layer substrate and the oxide film formed on the support substrate.

4. The manufacturing method of a semiconductor substrate according to claim 2, wherein the spontaneous oxidation film on the first silicon surface of the active layer substrate is removed through at least one of cleaning and etching.

5. The manufacturing method of a semiconductor substrate according to claim 4, wherein the spontaneous oxidation film is removed through at least one of SC1 cleaning, HF cleaning, and mechanical polishing.

6. The manufacturing method of a semiconductor substrate according to claim 4, wherein the spontaneous oxidation film is removed through at least one of SC1 cleaning, HF cleaning, and mechanical polishing and in addition, through SC2 cleaning or SPM cleaning.

7. The manufacturing method of a semiconductor substrate according to claim 1, further comprising forming a semiconductor device in the active layer substrate.

8. The manufacturing method of a semiconductor substrate according to claim 7, wherein the forming of the semiconductor device includes exposing a third silicon surface of the active layer substrate opposite to the second silicon surface.

9. The manufacturing method of a semiconductor substrate according to claim 8, wherein the exposing of the third silicon surface of the active layer substrate is after the bonding of the exposed second silicon surface of the active layer substrate to the oxide film formed on the support substrate.

10. The manufacturing method of a semiconductor substrate according to claim 1, wherein the active layer excludes implanted hydrogen ions.

11. The manufacturing method of a semiconductor substrate according to claim 1, wherein the forming crystal defects includes removal of a spontaneous oxidation film formed on the silicon surface of the active layer substrate.

12. The manufacturing method of a semiconductor substrate according to claim 11, wherein the removal of the spontaneous oxidation film includes a cleaning method capable of removing the single-crystal silicon and the spontaneous oxidation film.

13. A manufacturing method of a semiconductor device, comprising:
   exposing a first silicon surface of an active layer substrate made of single-crystal silicon, to which a second silicon surface is to be formed;
   forming an oxide film on a support substrate made of single-crystal silicon;
   bonding the second silicon surface of the active layer substrate to the oxide film formed on the support substrate and removing a portion of a third surface of the active layer substrate opposite to a bonding surface;
   after bonding, forming crystal defects on the entire second silicon surface of said active layer substrate; and
   forming the semiconductor device to the third surface portion of the active layer substrate opposite to the bonding surface,
   wherein no dopant remains in the second silicon surface as the bonding surface between the second silicon surface of the active layer substrate and the oxide film formed on the support substrate.

14. The manufacturing method of a semiconductor device according to claim 13, wherein a spontaneous oxidation film formed on the first surface of the active layer substrate is removed to expose the second silicon surface.

15. The manufacturing method of a semiconductor device according to claim 13, wherein crystal defects are formed in the second silicon surface as the bonding surface between the second silicon surface of the active layer substrate and the oxide film formed on the support substrate.

16. The manufacturing method of a semiconductor device according to claim 13, wherein the spontaneous oxidation film on the first silicon surface of the active layer substrate is removed through at least one of cleaning and etching.

17. The manufacturing method of a semiconductor device according to claim 16, wherein the spontaneous oxidation film is removed through at least one of SC1 cleaning, HF cleaning, and mechanical polishing.

18. The manufacturing method of a semiconductor device according to claim 16, wherein the spontaneous oxidation film is removed through at least one of SC1 cleaning, HF cleaning, and mechanical polishing and in addition, through SC2 cleaning or SPM cleaning.

19. The manufacturing method of a semiconductor substrate according to claim 13, wherein the active layer excludes implanted hydrogen ions.

* * * * *